United States Patent [19]
Okamoto

[11] Patent Number: 6,104,129
[45] Date of Patent: Aug. 15, 2000

[54] MULTILAYER ELECTROSTRICTIVE ELEMENT AND METHOD OF MANUFACTURING SAME

[75] Inventor: Yasuhiro Okamoto, Tondabayashi, Japan

[73] Assignee: Minolta Co., Ltd., Osaka, Japan

[21] Appl. No.: 09/020,675

[22] Filed: Feb. 9, 1998

[30] Foreign Application Priority Data

Feb. 10, 1997 [JP] Japan .................................. 9-026424

[51] Int. Cl.<sup>7</sup> .................................................. H01L 41/047
[52] U.S. Cl. ............................................................ 310/366
[58] Field of Search ..................................... 310/328, 366

[56] References Cited

U.S. PATENT DOCUMENTS

| | | | |
|---|---|---|---|
| 4,523,121 | 6/1985 | Takahashi et al. | 310/334 |
| 4,803,763 | 2/1989 | Eturo et al. | 310/328 |
| 4,845,399 | 7/1989 | Yasuda et al. | 310/366 |
| 5,254,212 | 10/1993 | Someji et al. | 156/630 |
| 5,300,852 | 4/1994 | Isogai et al. | 310/358 |
| 5,406,164 | 4/1995 | Okawa et al. | 310/366 |
| 5,459,371 | 10/1995 | Okawa et al. | 310/363 |
| 5,510,666 | 4/1996 | Watanabe et al. | 310/328 |
| 5,523,645 | 6/1996 | Inoi | 310/364 |

*Primary Examiner*—Thomas M. Dougherty
*Attorney, Agent, or Firm*—McDermott, Will & Emery

[57] ABSTRACT

A multilayer electrostrictive element having a first external electrode connected to an internal electrode on alternate layers on a first side surface of an electrostrictive structure having a plurality of electrostrictive substrates and internal electrodes and a second external electrode is connected to said other internal electrode on alternating layers, said first and second external electrodes having a plurality of projections protrude at a pitch corresponding to said internal electrode on alternating layers of said multilayer structure and a paste-like insulation agent applied with equal thickness to the respective side surface of said first and second electrodes of said multilayer structure. The plurality of projections of the first and second external electrodes is connect to each internal electrode taking away the insulation agent.

18 Claims, 5 Drawing Sheets

MULTILAYER ELECTROSTRICTIVE ELEMENT AND METHOD OF MANUFACTURING SAME

BACKGROUND OF THE INVENTION

This application is based on Application No. HEI 9-26424 filed in Japan, the content of which is hereby incorporated by reference.

FIELD OF THE INVENTION

The present invention relates to a multilayer electrostrictive element and method of manufacturing same, and specifically relates to a method of manufacturing the external electrode of a multilayer electrostrictive element.

DESCRIPTION OF THE RELATED ART

Heretofore there have been various proposals for multilayer electrostrictive elements using materials having a large electro-deformation effect. For example, U.S. Pat. No. 4,523,121 discloses the multilayer electrostrictive elements shown in FIGS. 1A, 1B, and FIG. 2.

The multilayer electrostrictive element shown in side view in FIG. 1A comprises a multilayer structure of alternating positive internal electrodes 2 and negative internal electrodes 2' interposed between thin plate-like electrostrictive substrates 1 formed of electrostrictive material. The side surfaces of this multilayer element are provided with external electrodes 3 and 3' respectively connected to said internal electrodes 2 and 2'. This multilayer electrostrictive element provides that the overlapping portion of positive and negative internal electrodes 2 and 2' is smaller than the total surface area of electrostrictive substrate 1, and said internal electrodes 2 and 2' do not overlap at the surface region, as can be understood from the plan view of FIG. 1B. This electrostrictive element is therefore subject to a tendency to breakdown and poor displacement efficiency because the central portion deforms whereas the surface portion does not deform.

The multilayer electrostrictive element shown in section view in FIG. 2 is an improvement on the aforesaid disadvantageous points. This multilayer electrostrictive element comprises a multilayer structure of alternating positive and negative internal electrodes 12 and 12' on the total surface of electrostrictive substrate 11. The side surfaces of this electrostrictive structure are coated with insulation agent 13 and 13' on alternating layers and superimposed over said insulation agent are external electrodes 14 and 14'. That is, on one side surface of this multilayer structure, the insulation agent 13 coats the negative internal electrode 12', and the external electrode 14 is connected to the positive internal electrode 12 which is not covered by said insulation agent 13. On the other side surface of this multilayer electrostrictive structure, however, insulation agent 13' coats the positive internal electrode 12, whereas the external electrode 14' is connected to the negative internal electrode 12' which is not covered by said insulation agent 13'.

In this multilayer electrostrictive element wherein the thickness of the electrostrictive substrate 11 is extremely thin at, for example, several hundred microns, it is difficult to apply the coating of insulation agent 13, 13' due to the very small spacing of the insulation agent 13, 13' coating the alternate layers of internal electrodes 12, 12'. That is, the position and amount of the coating of insulation agent 13, 13' is difficult to manage. Furthermore, the external electrodes 14, 14' are difficult to apply because said external electrodes 14, 14' must be applied so as to penetrate to the internal electrodes 12, 12' within the cavity formed between insulation agent 13, 13' where said insulation agent 13, 13' protrudes as projections from the side surface of the electrostrictive structure. Since external electrodes 14, 14' are formed via an application method, extracting a lead line from said external electrodes 14, 14' may easily damage said insulation agent 13, 13'.

SUMMARY OF THE INVENTION

The present invention provides a multilayer electrostrictive element constructed with an interior electrode on the entire region of the surface of an electrostrictive substrate so as to allow easy formation of an exterior electrode and method of manufacturing same. The present invention further provides a multilayer electrostrictive element which provides a durable external electrode and allows easy connection of said external electrode and an external device.

The present invention is a method to manufacture a multilayer electrostrictive element having a first external electrode connected to an internal electrode on alternate layers on a first side surface of an electrostrictive structure wherein a plurality of electrostrictive substrates and internal electrodes formed on the entire region of the surface of said electrostrictive structure are alternatingly overlaid, and a second external electrode is connected to said other internal electrode on alternating layers, said method comprising a first step and a second step. The aforesaid first external electrode is configured so as to have a plurality of projections protrude at a pitch corresponding to said internal electrode on alternating layers of said multilayer structure on one side of a plate-like structure. The aforesaid second electrode is configured so as to have a plurality of projections protrude at pitch corresponding to said other internal electrodes on alternating layers of said multilayer structure on one side of said plate-like structure. In the aforesaid first step, a paste-like insulation agent is applied with equal thickness to the respective side surface of said first and second electrodes of said multilayer structure. In the aforesaid second step, the surface on the side having said projections of said first and second external electrodes is pressed against the applied insulation agent, such that the projections of each said external electrode are thrust into said insulation agent so as to make contact with the corresponding internal electrodes on alternating layers exposed on the side surface of said multilayer structure, whereby said external electrodes are fixedly attached to the side surface of said multilayer structure in this state.

The present invention provides a method to manufacture another multilayer electrostrictive element.

The present invention is a method to manufacture a multilayer electrostrictive element having a first external electrode connected to an internal electrode on alternate layers on a first side surface of an electrostrictive structure wherein a plurality of electrostrictive substrates and internal electrodes formed on the entire region of the surface of said electrostrictive structure are alternatingly overlaid, and a second external electrode is connected to said other internal electrode on alternating layers, said method comprising a first step and a second step. The aforesaid first external electrode is configured so as to have a plurality of projections protrude at a pitch corresponding to said internal electrode on alternating layers of said multilayer structure on one side of a plate-like structure. The aforesaid second electrode is configured so as to have a plurality of projections protrude at pitch corresponding to said other internal electrodes on alternating layers of said multilayer structure on one side of said plate-like structure. In the aforesaid first step, a paste-like insulation agent is applied with to the respective side surface having projections of said first and second electrodes. In the aforesaid second step, the surface on the side having said application of insulation agent of the external electrode is pressed against the side surface of said multilayer structure such that the projections of said external electrode make contact with the corresponding internal electrodes on alternate layers exposed on the side surface of said multilayer structure, whereby said external electrodes are fixedly attached to the side surface of said multilayer structure in this state.

These and other objects, advantages and features of the invention will become apparent from the following description thereof taken in conjunction with the accompanying drawings which illustrate specific embodiments of the invention.

BRIEF DESCRIPTION OF THE DRAWINGS

In the following description, like parts are designated by like reference numbers throughout the several drawings.

DESCRIPTION OF THE PREFERRED EMBODIMENTS

A first embodiment of the method of manufacturing the multilayer electrostrictive element of the various embodiments of the present invention is described hereinafter with reference to the accompanying drawings.

Figure 4B:
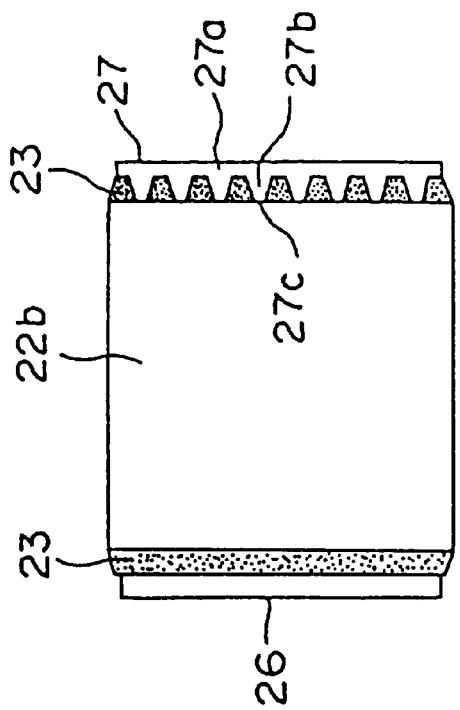
FIG. 4B is a section view of the multilayer electrostrictive element of FIG. 4A.
Figure 4A:
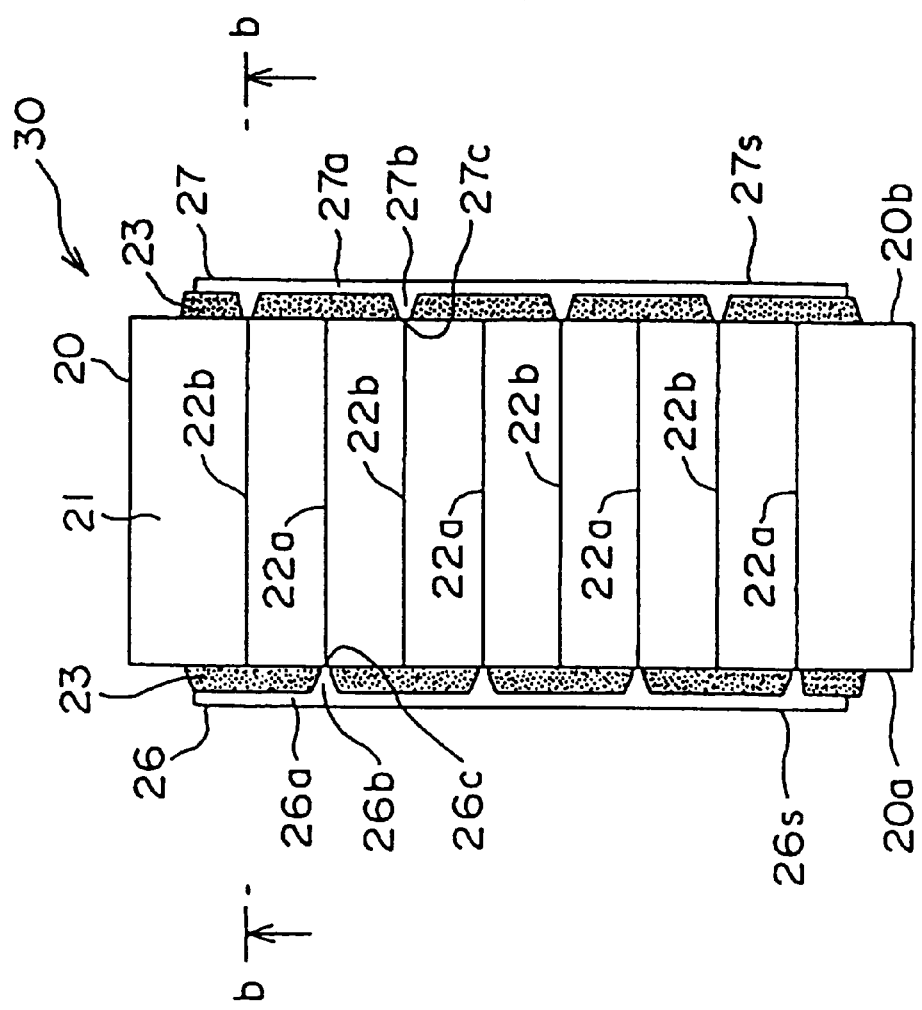
FIG. 4A is a side view of a first embodiment of the multilayer electrostrictive element of the present invention.

FIG. 4A is a side view of a first embodiment of a multilayer electrostrictive element, and FIG. 4B is a b—b section view of FIG. 4A. A multilayer electrostrictive element is manufactured by applying an insulation agent 23 to side surfaces 20a, 20b of a multilayer structure comprising positive and negative internal electrodes 22a, 22b alternatingly overlaid on a plurality of electrostrictive substrates 21 formed of electrostrictive material, then external electrodes 26, 27 provided with projections 26b, 27b are pressed against insulation agent 23, such that the tips 26c, 27c of said projections 26b, 27b penetrate said insulation agent 23 so as to make contact with the corresponding internal electrodes 22a, 22b, whereby in this state external electrodes 26, 27 are fixedly attached to side surfaces 20a, 20b of said multilayer structure.

Figure 1A:
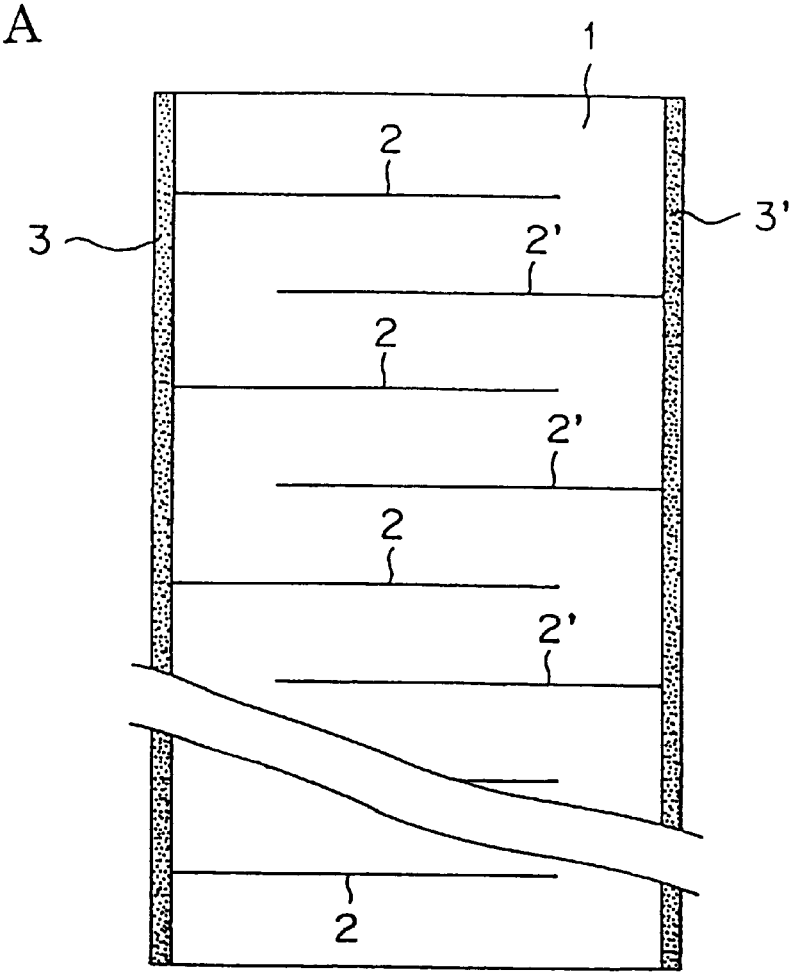
FIG. 1A is a side view of a conventional multilayer electrostrictive element.
Figure 1B:
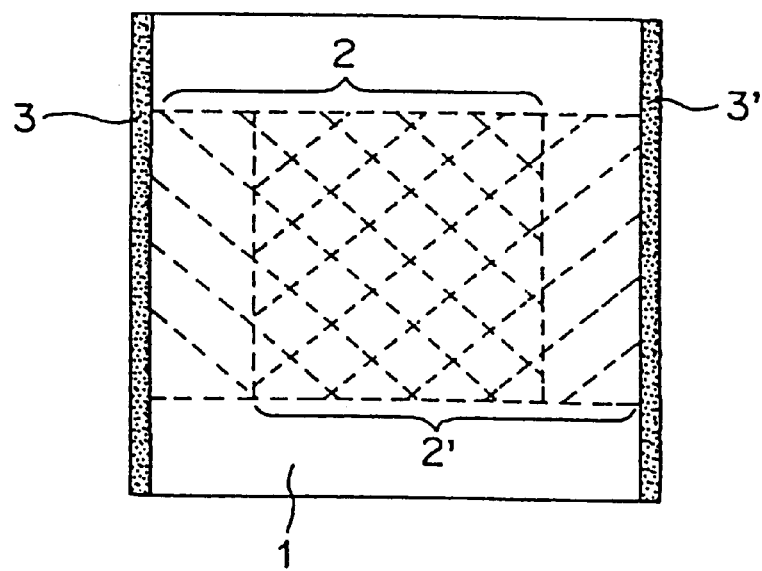
FIG. 1B is a section view of the multilayer electrostrictive element of FIG. 1A.
Figure 2:
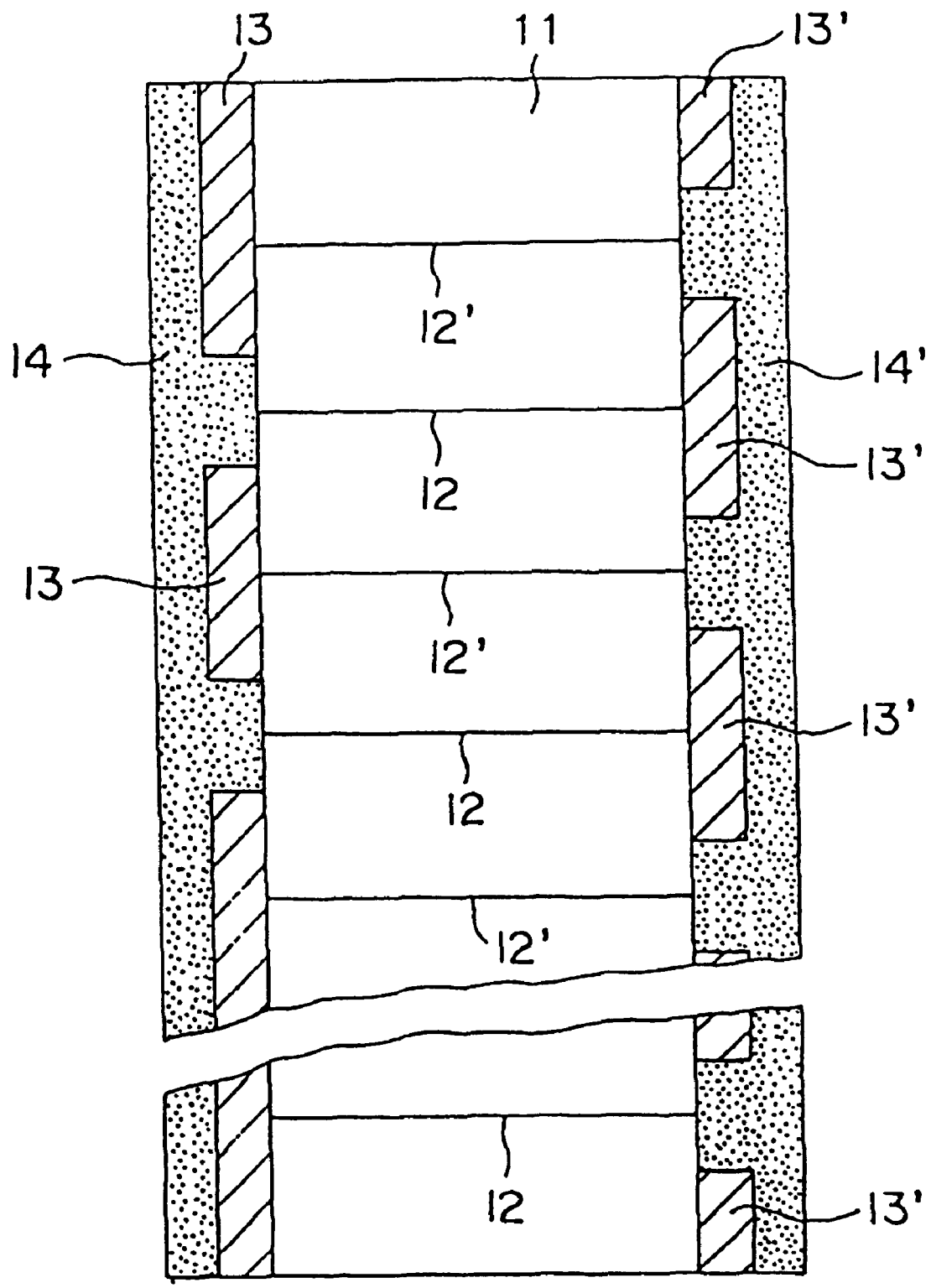
FIG. 2 is a side view of a conventional multilayer electrostrictive element.
Figure 3:
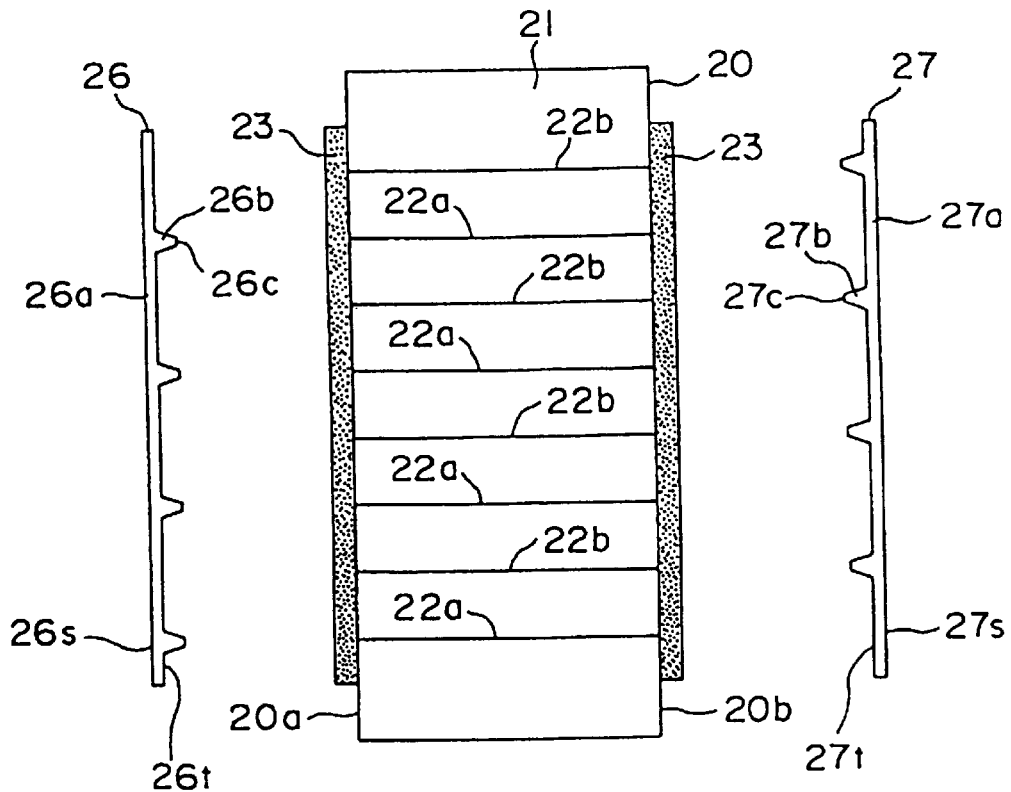
FIG. 3 is a side view during the manufacturing process of a first embodiment of the multilayer electrostrictive element of the present invention.

Specifically, multilayer structure 20 integratedly connects the electrostrictive substrate 21 and internal electrodes 22a, 22b similar to conventional multilayer electrostrictive elements. Insulation agent 23 is applied to the entire surface of side surfaces 20a, 20b of multilayer structure 20, so as to cover the internal electrodes 22a, 22b exposed from the sides surfaces 20a, 20b of multilayer structure 20, as shown in FIG. 3. The insulation agent 23 is evenly applied in a thin coating via a screen application method. Insulation agent 23 functions as an adhesive to bond electrostrictive substrate 21 and external electrodes 26, 27.

Figure 5A:
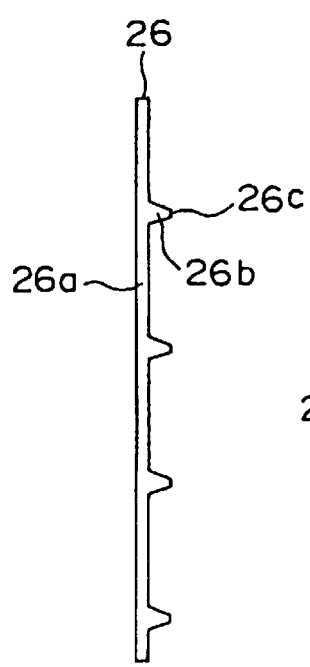
FIG. 5A is a side view of the external electrode of FIG. 3.
Figure 5B:
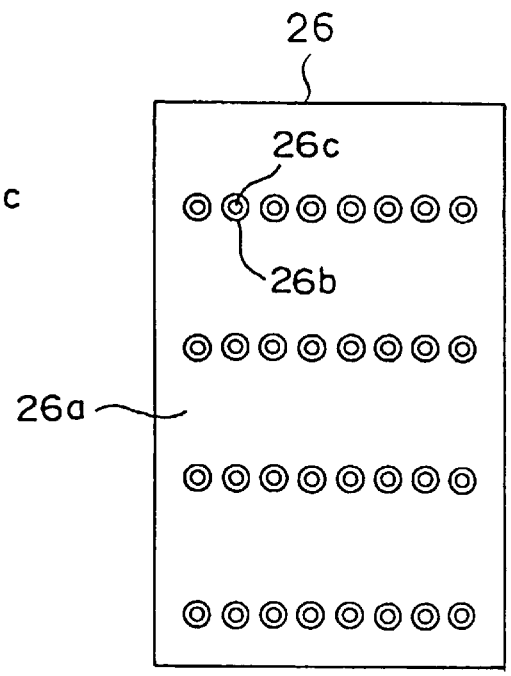
FIG. 5B is a front view of the external electrode of FIG. 3.

FIG. 5A is a side view if external electrode 26, FIG. 5B is a front view of the external electrode 26. External electrode 26 is an electrically conductive member comprising a plate-like body 26a and plurality of conical projections 26b protruding on one side of said body 26a. Each row of projections 26b of external electrode 26 is arranged at a pitch corresponding to internal electrode 22a of one alternating layer. Each row of projection 27b of external electrode 27 is arranged at a pitch corresponding to internal electrode 22b of another alternating layer. The projections 26b, 27b of the electrically conductive members 26, 27 may be formed in a desired configuration with excellent precision using, for example, electroplating art or etching art. Examples of suitable materials for forming the external electrode using the etching method include Cr, Al, Fe, Co, Ni, Cu, Zn, Ag, Sn, and SUS. Examples of suitable materials for forming the external electrode using the electroplating method include Cr, Fe, Co, Ni, Cu, Ag, Au, and Ni/W. The external electrode also may be formed using an electrically conductive material and a pressing process. External electrodes 26, 27 may use the same materials by inverting in one direction and an opposite direction members having the same configuration.

After the insulation agent 23 is applied to the side surfaces 20a, 20b of multilayer structure 20, the external electrodes 26, 27 are pressed against said insulation agent 23 at predetermined pressure. As shown in FIGS. 4A and 4B, at this time the conical projections 26b, 27b of external electrodes 26, 27 are pressed into and penetrate the insulation agent 23, such that the tips 26c, 27c of projections 26b, 27b make contact with the respective internal electrodes 22a, 22b exposed on the side surfaces 20a, 20b of multilayer structure 20. In this way the first external electrode 26 is electrically connected to the internal electrode 22a on one alternating layer, and the second external electrode 27 is electrically connected to internal electrode 22b on another alternating layer. As shown in FIG. 4A, at this time a plurality of projections 26b, 27b arranged in single rows of external electrodes 26, 27 are respectively touching a single corresponding internal electrode 22a, 22b. The positional alignment of external electrodes 26, 227 and internal electrodes 22a, 22b is readily accomplished by image processing or like art by providing markers on said external electrodes 26, 27.

External electrodes 26, 27 are fixedly adhered to side surfaces 20a, 20b of multilayer structure 20 via the adhesion of insulation agent 23 with projections 26a, 27a of external electrodes 26, 27 in a state of contact with their corresponding internal electrodes 22a, 22b. Even when insulating agent 23 does not contain an adhesive component, external electrodes 26, 27 can be fixedly attached by pressing against side surfaces 20a, 20b of multilayer structure 20 using another suitable method such as, for example, using another member, so as to maintain the conductivity between the projections 26b, 27b of external electrodes 26, 27 and internal electrodes 22a, 22b, or directly bonding the projections 26b, 27b of external electrodes 26, 27 to internal electrodes 22a, 22b via a suitable method.

In multilayer electrostrictive element 30 constructed as described above, the contact of an external member or exposed lead wire of the external electrode is accomplished at exterior surfaces 26s, 27s of bodies 26a, 27a of exterior electrodes 26, 27, i.e., surfaces 26s, 27s on the opposite side relative to the insulating agent 23. Accordingly, the contact of an external member or exposed lead wire of the external electrode is readily accomplished without breaking the damaging the insulating agent 23.

Figure 6:
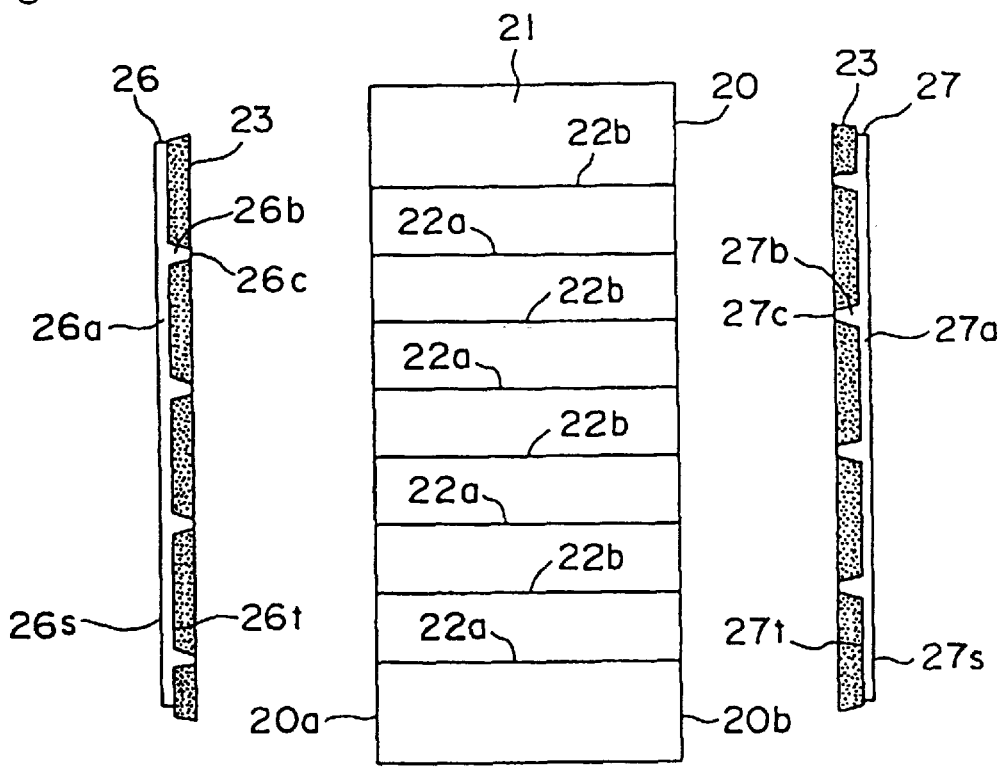
FIG. 6 is a side view during the manufacturing process of a second embodiment of the multilayer electrostrictive element of the present invention.

A second embodiment is described below with reference to the side view shown in FIG. 6.

Although the second embodiment of the multilayer electrostrictive element ultimately has the same construction as that of the multilayer electrostrictive element of the first embodiment, part of the manufacturing process differs from that of the multilayer electrostrictive element 30 of the first embodiment. The points of departure in the manufacturing process of the second embodiment are described below.

Rather than applying a coating of insulation agent 23 to the side surfaces 20a, 20b of multilayer structure 20, an insulation agent 23 containing an adhesive is applied via screen printing method to the side surfaces 26t, 27t of projections 26b, 27b of first and second electrically conductive materials 26, 27 so as to attain the same height as said projections 26b, 27b. Then, first and second external electrodes 26, 27 are pressed against said side surfaces 20a, 20b of multilayer structure 20 at predetermined positions, such that tips 26c, 27c of projections 26b, 27b of external electrodes 26, 27 make contact with the corresponding alternating layers of internal electrodes 22a, 22b exposed on side surfaces 20a, 20b of multilayer structure 20, thereby fixedly attaching external electrodes 26, 27 to said multilayer structure 20 via adhesion of insulation agent 23.

According to this manufacturing process, the tips 26c, 27c of projections 26b, 27b reliably make contact with the corresponding internal electrodes 22a, 22b interposing insulation agent 23 between said internal electrodes 22a, 22b and the tips 26c, 27c of projections 26b, 27b of external electrodes 26, 27.

Figure 7A:
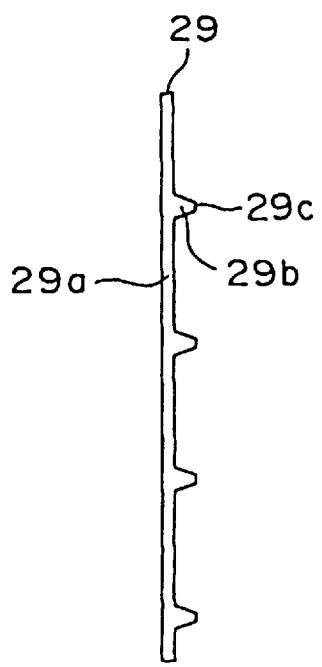
FIG. 7A is a side view of the external electrode of the multilayer electrostrictive element of the second embodiment of the invention.
Figure 7B:
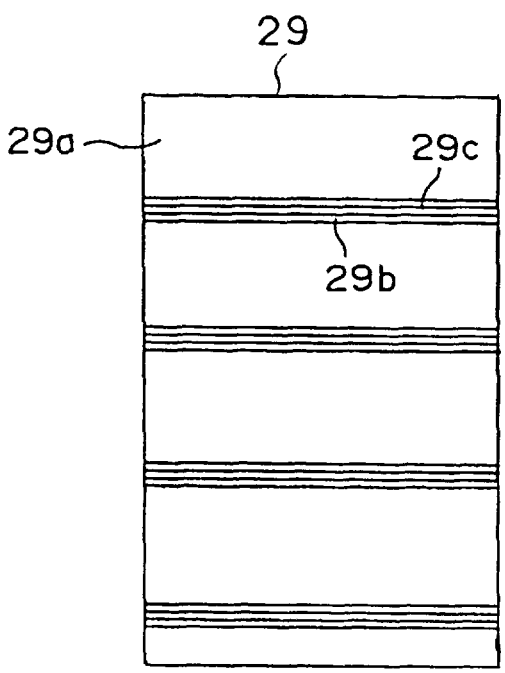
FIG. 7B is a front view of the external electrode of FIG. 7A.

A third embodiment is described below. FIG. 7A is a side view of external electrode 29, and FIG. 7B is a front view of external electrode 29.

The multilayer electrostrictive element of the third embodiment is provided with external electrode 29 which has a projection 29b of trapezoidal cross section substituted for the previously described row of a plurality of conical projections, and in a departure from the first and second embodiments, use of said external electrode 29 provides that a single projection 29b corresponds to and makes contact with a single internal electrode, whereas in other respects the multilayer electrostrictive element of the third embodiment is manufactured by the same process as the first and second embodiments.

Since the external electrode 29 is provided with a strip-like projection 29b the insulation agent 23 readily fills in between said projections 29b without gaps.

The previously described embodiments allow the simple manufacture of a multilayer electrostrictive element wherein internal electrodes 22a, 22b are formed on the entire surface of an electrostrictive substrate 21, and external electrodes 26, 27, 29 are formed on side surfaces 20a, 20b of multilayer structure 20.

Although preferred embodiment(s) of the invention have been described in the foregoing detailed description and illustrated in the accompanying drawings, it will be understood that the invention is not limited to the embodiment(s) disclosed, but is capable of numerous rearrangements, modifications and substitutions of parts and elements without departing from the spirit of the invention. Accordingly, the present invention is intended to encompass such rearrangements, modification and substitutions of parts and elements as fall within the spirit and scope of the invention.

What is claimed is:

1. A multilayer electrostrictive element comprising:

a stack formed by a plurality of electrostrictive substrates piled upon one another, said stack having a peripheral surface defining a cross-sectional area of said stack;

a plurality of interior electrodes disposed between said electrostrictive substrates, each of said internal electrodes having peripheral ends on said peripheral surface and each of said internal electrodes having an internal electrode area which is substantially equal to a cross-sectional area of said stack;

a first external electrode having a first plate like body and a plurality of first projections integral with the first plate like body, said plurality of first projections are protruded at a pitch corresponding to said internal electrode on alternate layers and connected to said internal electrodes on alternate layers; and a second external electrode having a second plate like body and a plurality of second projections integral with the second plate like body, said plurality of second projections are protruded at a pitch corresponding to said internal electrode on alternate layers and connected to said internal electrodes on alternate layers.

2. An element according to claim 1, further comprising:

an insulation member applied between said peripheral surface of the stack and said first and second external electrodes except a connecting area of said interior electrodes and said first and second projections of said first and second external electrodes.

3. An element according to claim 2, wherein the insulation member containing an adhesive.

4. An element according to claim 1, wherein the first external electrode and second external electrode are formed with electroplating art.

5. An element according to claim 1, wherein the first external electrode and second external electrode are formed with etching art.

6. An element according to claim 1, wherein the first external electrode and second external electrode are formed using an electrically conductive material.

7. An element according to claim 1, wherein the first external electrode and second external electrode are formed using a pressing process.

8. An element according to claim 1, wherein the plurality of projections of the first external electrode and second external electrode are conical projections.

9. An element according to claim 1, wherein cross sections of the plurality of projections of the first external electrode and second external electrode are trapezoid.

10. A multilayer electrostrictive element comprising:

a stack formed by a plurality of electrostrictive substrates piled upon one another, said stack having a peripheral surface defining a cross-sectional area of said stack;

a plurality of interior electrodes disposed between said electrostrictive substrates, each of said internal electrodes having peripheral ends on first and second opposing sides of said peripheral surface and each of said internal electrodes having an internal electrode area which is substantially equal to a cross-sectional area of said stack;

a paste-like adhesive insulating material formed on the first and second opposing sides said peripheral surface of the stack;

a first external electrode having a plate like body and a plurality of first projections integral with the plate like body, said first external electrode formed on said paste-like adhesive insulating material formed on the first opposing side of said peripheral surface with tip ends of said plurality of first projections protruding through said paste-like adhesive insulating material and connecting to said internal electrodes on alternate layers; and a second external electrode having a plate like body and a plurality of second projections integral with the plate like body, said second external electrode formed on said paste-like adhesive insulating material formed on the second opposing side of said peripheral surface with tip ends said plurality of second projections protruding through said paste-like adhesive insulating material and connecting on alternate layers to internal electrodes not connected to the first external electrode.

11. The multilayer electrostrictive element according to claim 10, wherein said plurality of first and second projections are formed in a plurality of rows with a single projection in each row, said single projection in each row having a trapezoidal cross section and extending across the respective side of said peripheral surface a distance substantially corresponding to the peripheral end of the internal electrode to which it connects.

12. The multilayer electrostrictive element according to claim 10, wherein the first external electrode and second external electrode are formed via an electroplating process.

13. The multilayer electrostrictive element according to claim 10, wherein the first external electrode and second external electrode are formed via an etching process.

14. The multilayer electrostrictive element according to claim 10, wherein the first external electrode and second external electrode are formed using an electrically conductive material.

15. The multilayer electrostrictive element according to claim 10, wherein the first external electrode and second external electrode are formed via a pressing process.

16. The multilayer electrostrictive element according to claim 10, wherein said plurality of first and second projections are formed in a plurality of rows with a plurality of conical projections in each row.

17. The multilayer electrostrictive element according to claim 10, wherein said first and second external electrodes and corresponding paste-like adhesive insulating material are each a common unit which is attached to the respective first and second opposing side of said peripheral surface.

18. The multilayer electrostrictive element according to claim 10, wherein said first and second external electrodes are each a single unit which is attached to the insulating material formed on the respective first and second opposing side of said peripheral surface.

* * * * *